(12) United States Patent
Lee (10) Patent No.: US 8,405,101 B2
(45) Date of Patent: Mar. 26, 2013

(54) SEMICONDUCTOR LIGHT EMITTING DEVICE AND METHOD OF MANUFACTURING THE SAME

(75) Inventor: Sang Hyun Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 703 days.

(21) Appl. No.: 12/252,605

(22) Filed: Oct. 16, 2008

(65) Prior Publication Data

US 2009/0101926 A1    Apr. 23, 2009

(30) Foreign Application Priority Data

Oct. 17, 2007    (KR) .................. 10-2007-0104525

(51) Int. Cl.
*H01L 33/08* (2010.01)

(52) U.S. Cl. .................. 257/95; 257/94; 257/E33.006; 257/E33.067

(58) Field of Classification Search .............. 257/88, 257/92, 94–99, E33.005, E33.006, E33.012, 257/79, E33.067

See application file for complete search history.

(56) References Cited

U.S. PATENT DOCUMENTS

| | | | |
|---|---|---|---|
| 7,023,020 B2 * | 4/2006 | Uemura | 257/94 |
| 2002/0005523 A1 * | 1/2002 | Taniguchi et al. | 257/79 |
| 2006/0208273 A1 * | 9/2006 | Kang | 257/103 |
| 2007/0085093 A1 * | 4/2007 | Ohmae et al. | 257/89 |
| 2009/0026476 A1 * | 1/2009 | Tazima et al. | 257/98 |

FOREIGN PATENT DOCUMENTS

| | | |
|---|---|---|
| JP | 2000-36621 A | 2/2000 |
| JP | 2005-101610 A | 4/2005 |
| JP | 2006-49551 A | 2/2006 |

* cited by examiner

*Primary Examiner* — Kenneth Parker
*Assistant Examiner* — Yu Chen
(74) *Attorney, Agent, or Firm* — Birch, Stewart, Kolasch & Birch, LLP (57) ABSTRACT

Provided are a semiconductor light emitting device and a method of manufacturing the same. The semiconductor light emitting device comprises a first conductive type semiconductor layer, an active layer divided in plurality on the first conductive type semiconductor layer, and a second conductive type semiconductor layer divided in plurality on the active layer.

19 Claims, 8 Drawing Sheets

SEMICONDUCTOR LIGHT EMITTING DEVICE AND METHOD OF MANUFACTURING THE SAME

CROSS-REFERENCE TO RELATED APPLICATIONS

The present application claims priority under 35 U.S.C. 126 to Korean Patent Application No. 10-2007-0104525 (filed on Oct. 17, 2007), which is hereby incorporated by reference in its entirety.

BACKGROUND

III-V group nitride semiconductors are diversely applied to an optical device such as a blue/green light emitting diode (LED), a high speed switching device such as a Metal Semiconductor Field Effect Transistor (MOSFET) and a Metero junction Field Effect Transistor (HEMT), and a light source of a lightening or displaying device.

The nitride semiconductor is mainly used as an LED or a laser diode (LD), and also researches for improving a manufacturing process or light efficiency has been continuously conducted.

SUMMARY

Embodiments provide a semiconductor light emitting device capable of increasing an effective light emitting area by dividing an active layer into a plurality of areas, and a method of manufacturing the same.

Embodiments provide a semiconductor light emitting device capable of improving light extraction efficiency of an active layer by dividing a semiconductor layer on or/and under an active layer into a plurality of areas, and a method of manufacturing the same.

Embodiments also improve heat dissipation efficiency by dividing an upper portion of a first conductive type semiconductor layer, an active layer, and a second conductive type semiconductor layer into a plurality of areas.

An embodiment provides a semiconductor light emitting device comprising: a first conductive type semiconductor layer; an active layer divided in plurality on the first conductive type semiconductor layer; and a second conductive type semiconductor layer divided in plurality on the active layer.

An embodiment provides a semiconductor light emitting device comprising: a light emitting structure comprising a first conductive type semiconductor layer, an active layer, and a second conductive type semiconductor layer; an area separation groove dividing the active layer and the second conductive type semiconductor layer into a plurality; an insulation layer in the area separation groove; and a conductive layer on the second conductive type semiconductor layer and the insulation layer.

An embodiment provides a method of manufacturing a semiconductor light emitting device comprising: sequentially forming a first conductive type semiconductor layer, an active layer, and a second conductive type semiconductor layer; forming an area separation groove to divide the sequentially formed layers into a plurality, at least from the second conductive type semiconductor layer to the active layer; forming a insulation layer in the area separation groove; and forming a conductive layer on the second conductive type semiconductor layer and the insulation layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor light emitting device according to an embodiment and a method of manufacturing the same will be described with reference to the accompanying drawings. In the description of embodiments, it will be understood that when a layer is referred to as being 'on' or 'under' another layer, the reference about 'on' and 'under' each layer will be made on the basis of drawings. Also, the thickness of each layer in the drawings is an example, and is not limited thereto.

Figure 1:
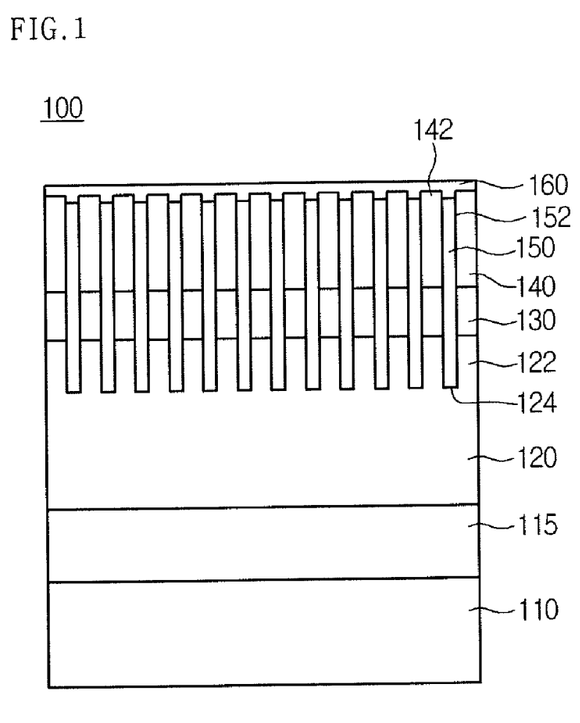
FIG. 1 is a cross-sectional view of a semiconductor light emitting device according to a first embodiment.

FIG. 1 is a cross-sectional view of a semiconductor light emitting device according to a first embodiment.

Referring to FIG. 1, a semiconductor light emitting device 100 comprises a substrate 110, a buffer layer 115, a first conductive type semiconductor layer 120, an active layer 130, a second conductive type semiconductor layer 140, an insulation layer 150, and a conductive layer 160.

The substrate 110 may be formed of one selected from $Al_2O_3$, GaN, SiC, ZnO, Si, Gap, and GaAs, and may be removed to form a first electrode layer after growing a semiconductor layer. Additionally, a jagged pattern is integrated into the top of the substrate 110, or an additional semiconductor material may be used to form a jagged structure on the top of the substrate 110.

The buffer layer 115 is formed on the substrate 110. The buffer layer 115 reduces a lattice constant with respect to a nitride semiconductor and may be formed of one selected from GaN, InN, InGaN, AlInN, AlGaN, and InAlGaN. Additionally, an undoped semiconductor layer (not shown) where no dopant is doped may be formed on the buffer layer 115, and at least one of the buffer layer 115 and the undoped semiconductor layer may be formed or both of them may be removed.

The first conductive type semiconductor layer 120 is formed on the buffer layer 115. The first conductive type semiconductor layer 120 may be realized with an n-type semiconductor layer of at least one layer, and the n-type semiconductor may be formed of one selected from GaN, InN, AlN, AlGaN, and InGaN, InAlGaN and a first conductive type dopant such as Si, Ge, Sn, Se, and Te is selectively doped into the n-type semiconductor.

An upper portion 122 of the first conductive type semiconductor layer 120 is divided into a plurality of areas.

A plurality of active layers 130 are formed on the first conductive type semiconductor layer 120. The active layer 130 comprises a single quantum well structure or a multi-quantum well structure. The active layer 130 is divided into a plurality on the upper portion 122 of the first conductive type semiconductor layer 120.

A plurality of second conductive type semiconductor layers 140 are formed on the active layer 130. The second conductive type semiconductor layer 140 may be realized with a p-type semiconductor layer of at least one layer. The p-type semiconductor layer is formed of one selected from GaN, InN, AlN, AlGaN, InGaN, and InAlGaN, and is doped with a second conductive type dopant (e.g., Mg and Zn). The second conductive type semiconductor layer 140 is divided into a plurality by the plurality of active layers 130.

The first conductive type semiconductor layer 120, the active layer 130, and the second conductive type semiconductor layer 140 may be defined as a light emitting structure. The first conductive type semiconductor layer 120 may be formed of a p-type semiconductor layer and the second conductive type semiconductor layer 140 may be formed of an n-type semiconductor layer. Additionally, a third conductive type semiconductor layer (not shown) may be formed on the second conductive type semiconductor layer 140, and may comprise an n-type semiconductor layer or a p-type semiconductor layer. The light emitting structure may comprise one of an N-P junction structure, a P-N junction structure, an N-P-N junction structure, and a P-N-P junction structure, but is not limited thereto. Additionally, the light emitting structure comprises at least one of an undoped semiconductor layer, a buffer layer, a substrate, and a first electrode layer on or under the first conductive type semiconductor layer 120.

An area separation groove 152 for a plurality of divided areas is formed in the upper portion 122 of the first conductive type semiconductor layer 120, the active layer 130, and the second conductive type semiconductor layer 140. The area separation groove 152 divides the active layer 130 and the second conductive type semiconductor layer 140 into a plurality of areas. Here, the area separation groove 152 may be formed from the second conductive type semiconductor layer 140 to the active layer 130, or from the second conductive type semiconductor layer 140 to the upper portion 122 of the first conductive semiconductor layer 120.

The area separation groove 152 may have one of a circular pattern, a concentric pattern, a polygonal pattern, a zigzag pattern, a bent pattern, a jagged pattern, and a wave pattern, being viewed from a chip surface. At this point, since the active layer 130 emits light through the top and side of each area, its effective light emitting area may be increased.

The insulation layer 150 is formed in the area separation groove 152. The insulation layer 150 is formed of a transmittive and insulating material such as $SiO_2$, $Si_3N_4$, $Al_2O_3$, and $TiO_2$. The top of the insulation layer 150 may be equal in height to the exposed top of the second conductive type semiconductor layer 140.

The conductive layer 160 is formed on the insulation layer 150 and the second conductive type semiconductor layer 140, and electrically connects an upper portion 142 of the plurality of divided second conductive type semiconductor layers 140. The conductive layer 160 may be formed of a third conductive type semiconductor layer such as a transparent electrode layer or a conductive type semiconductor layer, for example.

Hereinafter, the conductive layer 160 will be described with a transparent electrode layer in the first embodiment.

The semiconductor light emitting device 100 increases an effective light emitting area of the active layer 130. Since the second conductive type semiconductor layer 140 on the active layer 130 and the upper portion 122 of the first conductive type semiconductor layer 120 under the active layer 130 are divided in plurality, it distributes a supplied current of the active layer 130. Accordingly, light extraction efficiency of the active layer 130 can be improved and effective heat dissipation can be obtained.

FIGS. 2 to 6 are views illustrating manufacturing processes of a semiconductor light emitting device according to the first embodiment.

Figure 2:
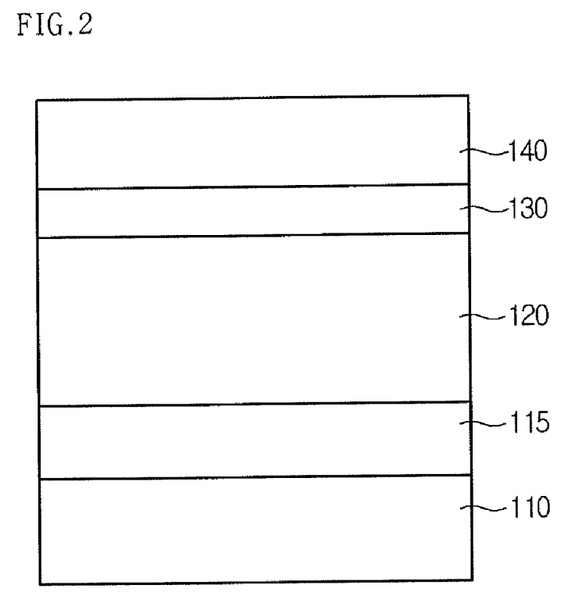
FIGS. 2 to 6 are views illustrating manufacturing processes of a semiconductor light emitting device according to the first embodiment.

Referring to FIG. 2, a buffer layer 115, a first conductive type semiconductor layer 120, an active layer 130, and a second conductive type semiconductor layer 140 are sequentially formed on a substrate 110. Another semiconductor layer may be formed between the above layers but is not limited thereto.

The substrate 110 may be formed of one selected from $Al_2O_3$, GaN, SiC, ZnO, Si, GaP, and GaAs. The buffer layer 115 may be formed of one selected from GaN, InN, InGaN, AlInN, AlGaN, and InAlGaN. Additionally, an undoped semiconductor layer (not shown) where no dopant is doped may be formed on the buffer layer 115 but is not limited thereto.

A III-V group nitride semiconductor is grown on the substrate 110. Its growing equipment comprises an electron beam evaporator, a physical vapor deposition (PVD) equipment, a chemical vapor deposition (CVD) equipment, a plasma laser deposition (PLD) equipment, a dual-type thermal evaporator, a sputtering equipment, and a metal organic chemical vapor deposition (MOCVD) equipment, but is not limited thereto.

The first conductive type semiconductor layer 120 is formed on the buffer layer 115, and may be formed of an n-type semiconductor layer doped with a first conductive type dopant. The n-type semiconductor layer may be formed of one of GaN, InN, AlN, AlGaN, InGaN, and InAlGaN.

The active layer 130 is formed on the first conductive type semiconductor layer 120, and has a single quantum well structure or a multi-quantum well structure. The active layer 130 may be formed of different light emitting materials according to an emitted light wavelength. A quantum well layer and a quantum barrier layer may be periodically formed with InGaN/GaN or InGaN/AlGaN.

The second conductive type semiconductor layer 140 is formed on the active layer 130, and may be a p-type semiconductor layer doped with a second conductive type dopant. The p-type semiconductor layer is formed of one of GaN, InN, AlN, AlGaN, InGaN, and InAlGaN.

The first conductive type semiconductor layer 120, the active layer 130, and the second conductive type semiconductor layer 140 may be defined as a light emitting structure. The light emitting structure may comprise one of an N-P junction structure, a P-N junction structure, an N-P-N junction structure, and a P-N-P junction structure, but is not limited thereto.

Figure 3:
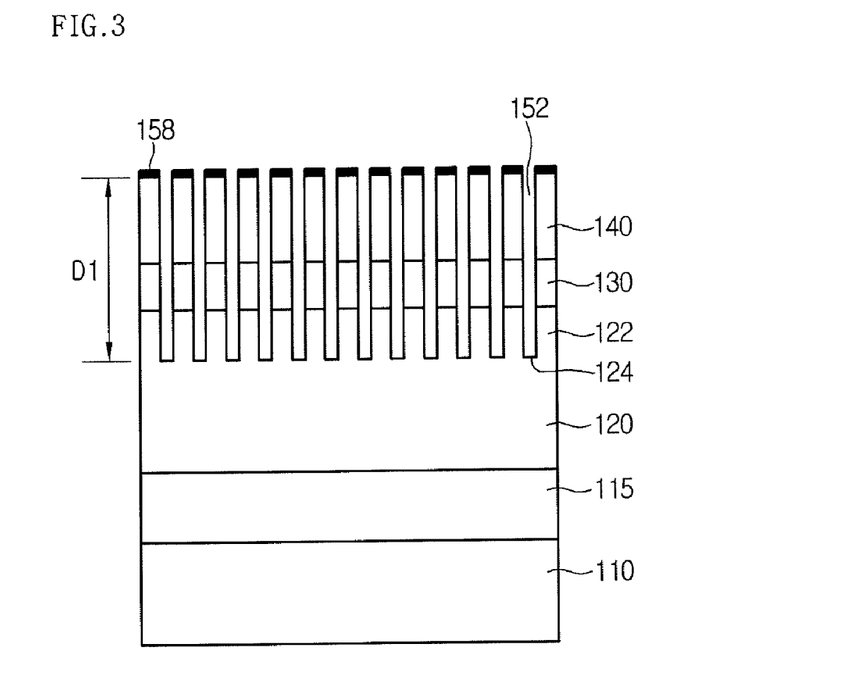

Referring to FIG. 3, after a mask pattern 158 of a predetermined form is formed on the second conductive type semiconductor layer 140, an etching process is performed through an etching equipment (e.g., an inductively coupled plasma (ICP) equipment), a plurality of area separation grooves 152 are formed in the second conductive type semiconductor layer 140, the active layer 130, and the upper portion 122 of the conductive type semiconductor layer 120.

The lower end 124 of the area separation groove 152 is formed with a depth D1 dividing the upper portion 122 of the first conductive type semiconductor layer 120, or formed with a depth identical to the lower end of the active layer 130.

The upper portion 122 of the first conductive type semiconductor layer 120, the active layer 130, and the second conductive type semiconductor layer 140 are divided into a plurality of areas by the area separation grooves 152. Here, the upper portion 122 of the first conductive type semiconductor layer 120 is divided into a plurality, and the active layers 130 is disposed on the plurality of divided upper portions 122.

Here, if the active layer 130 is divided into a plurality of areas, the entire active layer 130 can increase an effective light emitting area.

Figure 4:
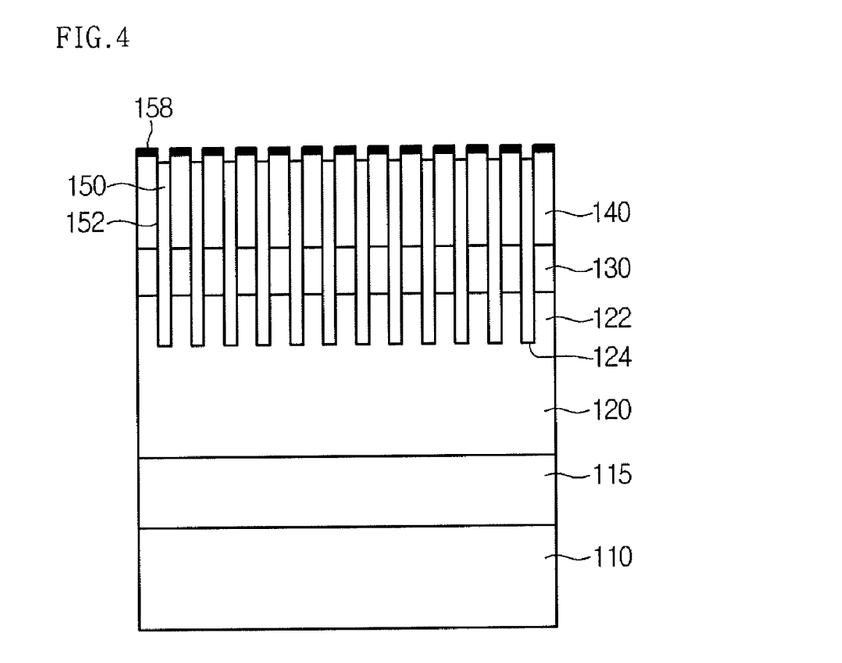

Referring to FIGS. 3 and 4, an insulation layer 150 is formed in the area separation groove 152. Once the insulation layer 150 is formed, the mask pattern 158 on the second conductive type semiconductor layer 140 is removed. The insulation layer 150 is formed until only the upper end of the second conductive type semiconductor layer 140 is exposed.

The insulation layer 150 is formed of a transmittive and insulating material such as $SiO_2$, $Si_3N_4$, $Al_2O_3$, and $TiO_2$.

Figure 5:
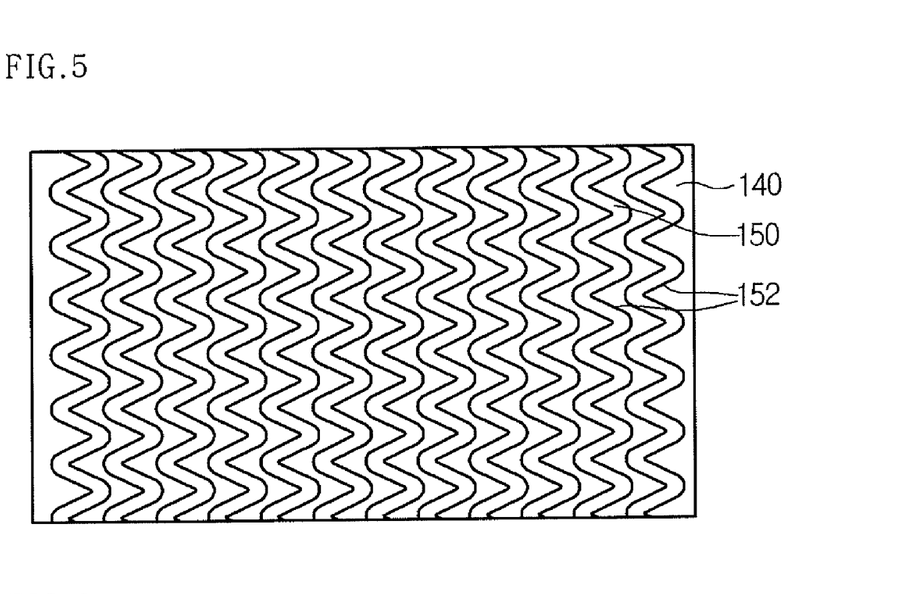

Referring to FIGS. 4 and 5, the area separation groove 152 filled with the insulation layer 150 may have a wave pattern (e.g., repetitive "S") with a predetermined period in one direction of a chip. The plurality of area separation grooves 152 may be formed at a predetermined interval or an irregular interval. The width or separation interval of the area separation groove 152 may vary based on a chip size or a pattern of the area separation groove 152.

The pattern of the area separation groove 152 may have a predetermined curvature or a predetermined angle and may be a zigzag pattern or a jagged pattern.

Figure 6:
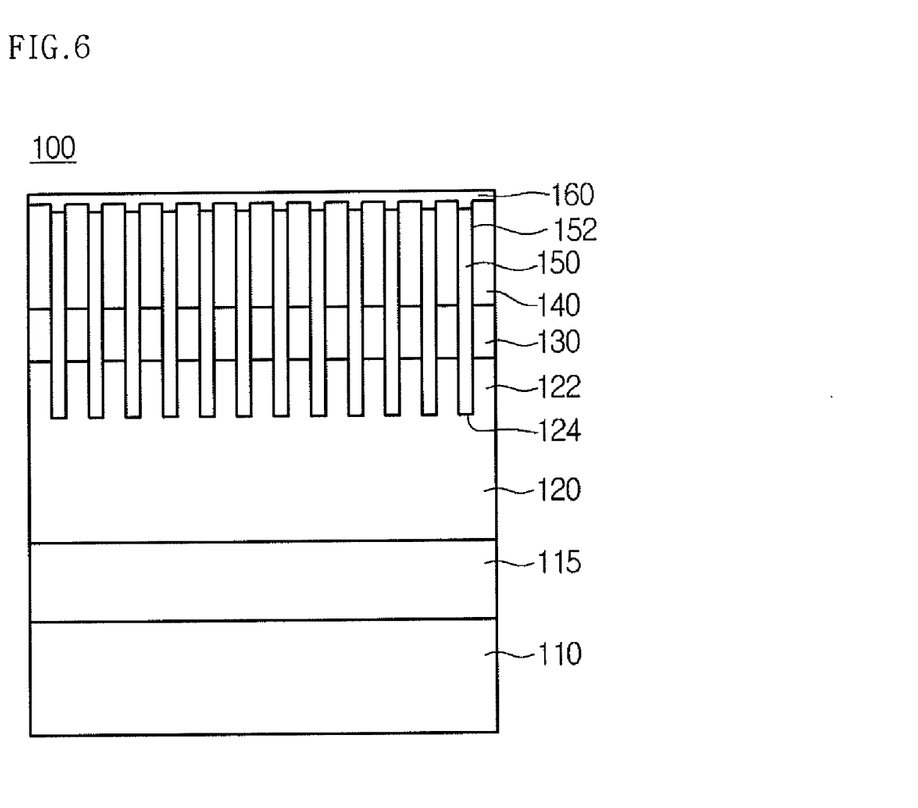

Referring to FIG. 6, a conductive layer 160 is formed on the insulation layer 150 and on the second conductive type semiconductor layer 140. The conductive layer 160 electrically connects the plurality of divided second conductive type semiconductor layer 140.

Figure 7:
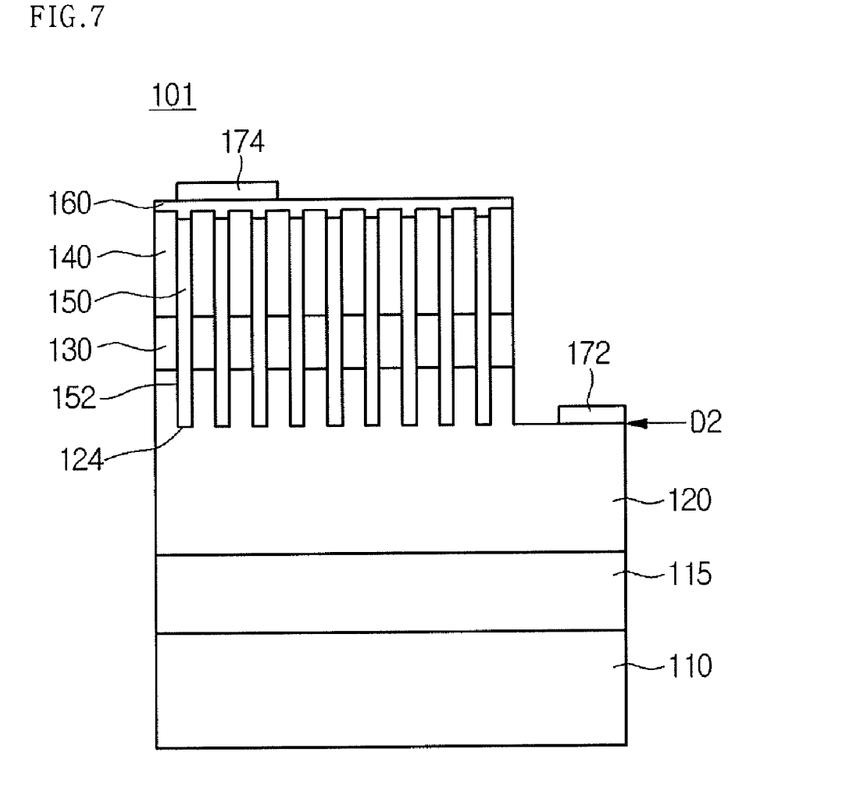
FIG. 7 is a cross-sectional view of a lateral-type semiconductor light emitting device using a structure of FIG. 1.
Figure 8:
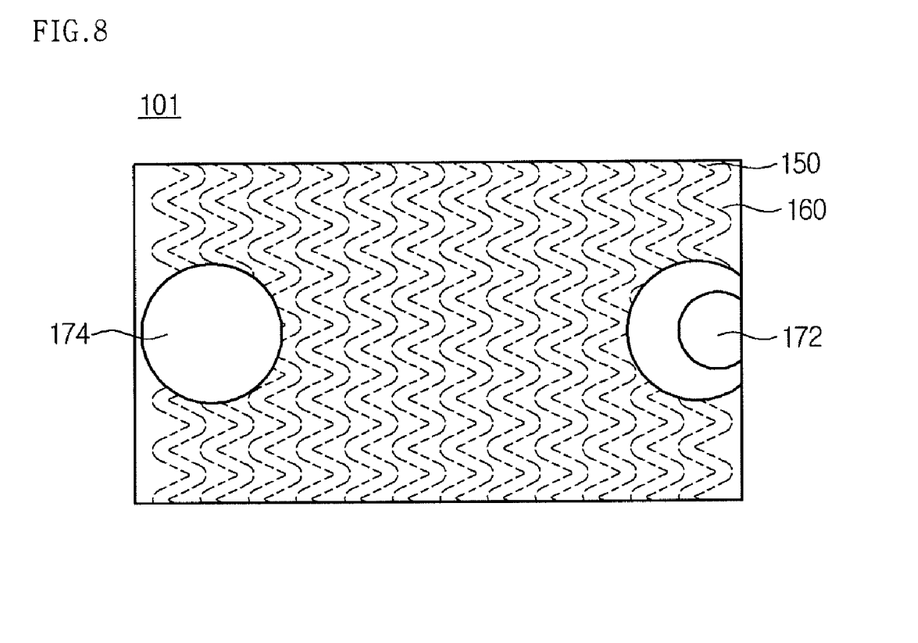
FIG. 8 is a plan view of FIG. 7.
Figure 9:
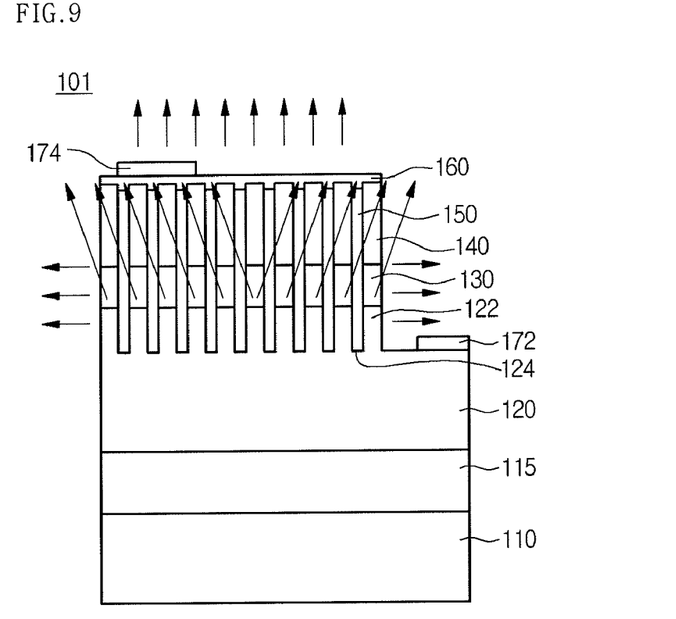
FIG. 9 is a view of light emission distribution in the lateral-type semiconductor light emitting device of FIG. 7.

FIG. 7 is a cross-sectional view of a lateral-type semiconductor light emitting device using a structure of FIG. 1. FIG. 8 is a plan view of FIG. 7. FIG. 9 is a view of light emission distribution in the lateral-type semiconductor light emitting device of FIG. 7.

Referring to FIGS. 7 to 9, a semiconductor light emitting device 101 exposes a portion of the first conductive type semiconductor layer 120. A first electrode layer 172 is formed on the portion of the first conductive type semiconductor layer 120, and a second electrode layer 174 of a predetermined pattern is formed on the conductive layer 160.

Here, the first electrode layer 172 is formed with a depth D2 equal to or lower than the lower end 124 of the area separation groove 152. This effectively distributes a supplied current of the first electrode layer 172.

The second electrode layer 174 may be realized with a predetermined pattern such as a circuit pattern (as illustrated in FIG. 8), a polygonal pattern, or a matrix pattern.

Once power is supplied through the first electrode layer 172 and the second electrode layer 174, the upper portion 122 of the first conductive type semiconductor layer 120 distributes a current supplied to the first electrode layer 172 and then delivers the distributed current into the active layer 130. The second conductive type semiconductor layer 140 diverges a current supplied through the conductive layer 160 and then delivers the diverged current into the active layer 130. At this point, each divided area of the active layer 130 emits light toward entire directions (top, bottom, and side).

Since the active layer 130 has an increased effective light emitting area because of a divided structure, light efficiency can be improved Additionally, since current is supplied to the active layer 130 through dispersion and distribution, light extraction efficiency of the active layer 130 can be improved. Since the upper portion 122 of the first conductive type semiconductor layer 120, the active layer 130, and the second conductive type semiconductor layer 140 are divided into plurality, heat dissipation can be effectively obtained.

Figure 10:
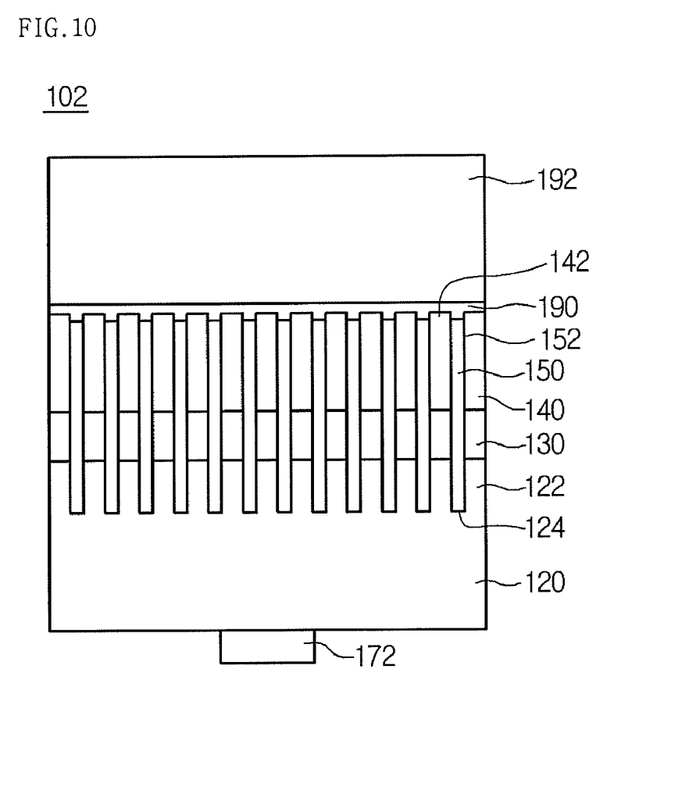
FIG. 10 is a view of a vertical-type semiconductor light emitting device using a structure of FIG. 1.

FIG. 10 is a view of a vertical-type semiconductor light emitting device using a structure of FIG. 1.

Referring to FIG. 10, in a semiconductor light emitting device 102, an electrode layer 190 is formed on an upper portion 142 of a second conductive type semiconductor layer 140 and a conductive support substrate 192 is formed on the electrode layer 190.

Once the conductive support substrate 192 is formed, the substrate 110 and the buffer layer 115 of FIG. 1 may be removed through a physical and/or chemical method.

The electrode layer 190 may be selectively formed of a reflective electrode material such as Al, Ag, Pd, Rh, Pt, and a compound thereof. The conductive supporter substrate 192 may be formed of copper, gold or a carrier wafer of Si, Ge, GaAs, or ZnO.

An ohmic contact layer of tin doped indium oxide (ITO), zinc doped indium oxide (IZO) or Al doped zinc oxide (AZO) may be formed with a predetermined pattern between the electrode layer 190 and the second conductive type semiconductor layer 140.

Figure 11:
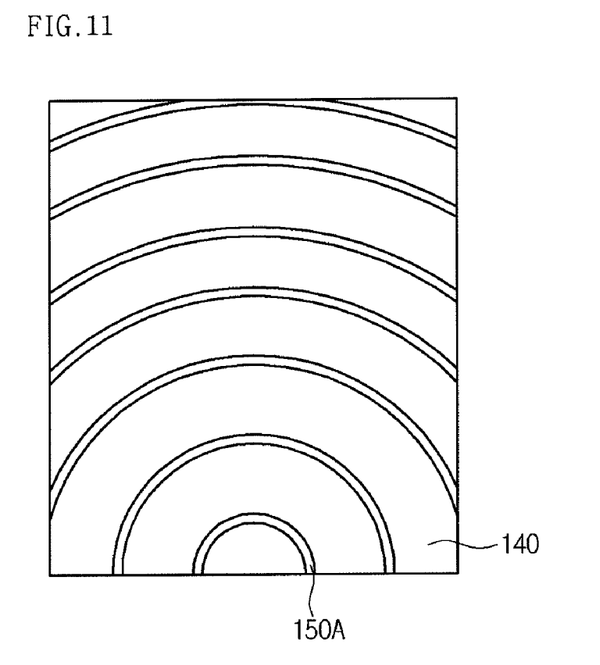
FIGS. 11 to 13 are plan views illustrating various area separation groove patterns of the semiconductor light emitting device according to the first embodiment.
Figure 12:
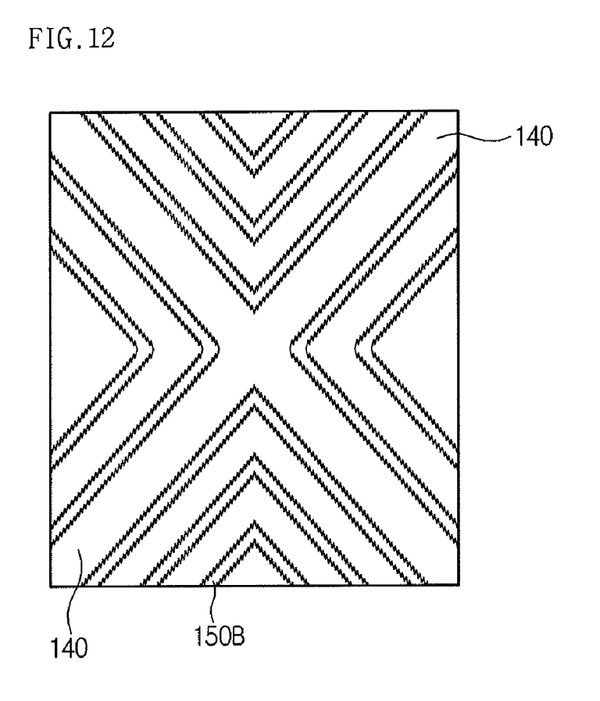
Figure 13:
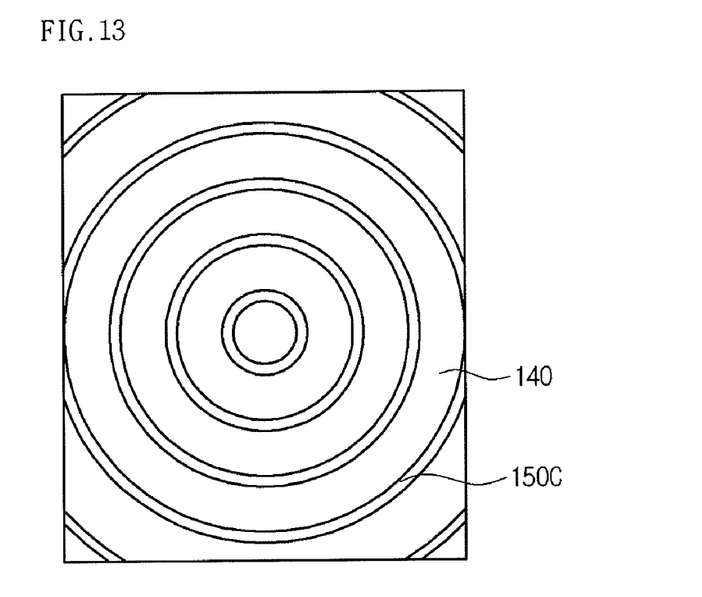

FIGS. 11 to 13 are plan views illustrating various area separation groove patterns of the semiconductor light emitting device according to the first embodiment.

Referring to FIG. 11, an area separation groove 150A is formed with a concentric pattern in the second conductive type semiconductor layer 140. The concentric pattern may be formed at a predetermined interval or an irregular interval.

Referring to FIG. 12, an area separation groove 150B is symmetric at least two directions with respect to a predetermined position (e.g., the center) of a chip, and has a bent form of a predetermined angle 90°. The pattern surface of the area separation groove 150B may have a fine jagged form in a vertical direction (i.e., a growing direction). This fine jagged form may be applied to another pattern, but is not limited thereto.

Referring to FIG. 13, an area separation groove 150C may have circular patterns having respectively different intervals with respect to a predetermined position (e.g., the center) of a chip. At this point, the area separation groove 150C may be formed at a predetermined interval or an irregular interval.

The area separation groove 150C may have the above-mentioned pattern, a polygonal pattern, a jagged pattern, a zigzag pattern at a predetermined interval or an irregular interval. These patterns may vary if necessary.

Figure 14:
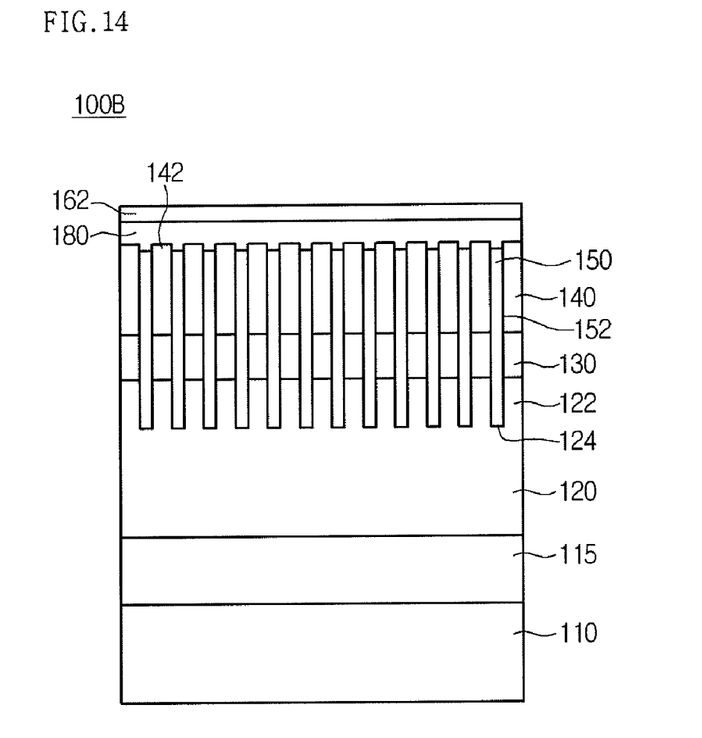
FIG. 14 is a cross-sectional view of a semiconductor light emitting device according to a second embodiment.

FIG. 14 is a cross-sectional view of a semiconductor light emitting device according to a second embodiment. During describing of the second embodiment, overlapping description between the first and second embodiments will be omitted.

Referring to FIG. 14, a semiconductor light emitting device 100B comprises a substrate 110, a buffer layer 115, a first conductive type semiconductor layer 120, an active layer 130, a second conductive type semiconductor layer 140, an insulation layer 150, a third conductive type semiconductor layer 180, and an electrode layer 162.

An area separation groove 152 divides the upper portion 122 of the first conductive type semiconductor layer 120, the active layer 130, and the second conductive type semiconductor layer 140 into a plurality of areas, and the insulation layer 150 having a light transmitting property is formed.

The third conductive type semiconductor layer 180 of at least one layer is formed on the plurality of second conductive type semiconductor layer 140. Here, the third conductive type semiconductor layer 180 electrically connects an upper portion 142 of the plurality of second conductive type semiconductor layers 140 and thus serves as a conductive layer.

The third conductive type semiconductor layer 180 may be formed of the p-type semiconductor layer or the n-type semiconductor layer, or may be formed of a semiconductor layer identical to or different from the second conductive type semiconductor layer 140. In this embodiment, the third conductive type semiconductor layer 180 may be an n-type semiconductor layer doped with a first conductive type dopant. The n-type semiconductor layer may comprise one of GaN, InN, AlN, AlGaN, InGaN, and InAlGaN.

The electrode layer 162 is formed on the third conductive type semiconductor layer 180. The electrode layer 162 may be formed of a transparent material or a reflective material. If the electrode layer 162 is a transparent electrode layer, it may be formed of the transparent material such as ITO, ZnO, RuOx, TiOx, and IrOx. If the electrode layer 162 is a reflective electrode layer, it is formed of the reflective material such as Al, Ag, Pd, and Rh, Pt.

The semiconductor light emitting device 100B may comprise a lateral-type semiconductor light emitting device or a vertical-type semiconductor light emitting device.

Figure 15:
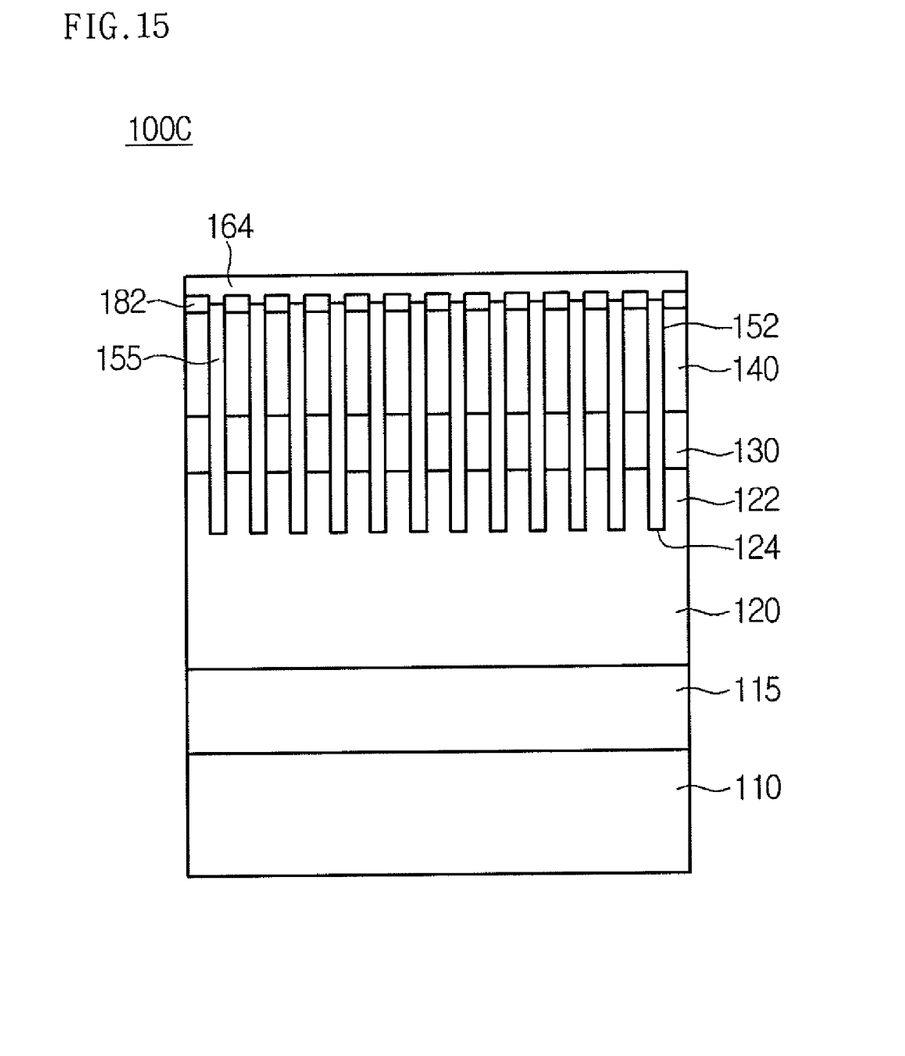
FIG. 15 is a cross-sectional view of a semiconductor light emitting device according to a third embodiment.

FIG. 15 is a cross-sectional view of a semiconductor light emitting device according to a third embodiment. During describing of the third embodiment, overlapping description between the first and third embodiments will be omitted.

Referring to FIG. 15, a buffer layer 115, a first conductive type semiconductor layer 120, an active layer 130, a second conductive type semiconductor layer 140, and third conductive type semiconductor layer 182 are sequentially formed on a substrate 110 of a semiconductor light emitting device 100C.

The third conductive type semiconductor layer 182 may be formed of the p-type semiconductor layer or the n-type semiconductor layer or may be formed of a semiconductor layer identical to or different from the second conductive type semiconductor layer 140. In this embodiment, the third conductive type semiconductor layer 182 may be an n-type semiconductor layer doped with a first conductive type dopant, and may be formed of GaN, InN, AlN, AlGaN, InGaN, or InAlGaN.

An area separation groove 152 is etched with a depth from the third conductive type semiconductor layer 182 to the upper portion 122 of the first conductive type semiconductor layer 120, and is arranged in plurality in a parallel direction of a chip. At this point, the area separation groove 152 divides the upper portion 122 of the first conductive type semiconductor layer 120, the active layer 130, the second conductive type semiconductor layer 140, and the third conductive type semiconductor layer 182 into a plurality of areas.

An insulation layer 155 is formed on the area separation groove 152 until only the upper end of the third conductive type semiconductor layer 182 is exposed. The insulation layer 155 may be formed of one selected from $SiO_2$, $Si_3N_4$, $Al_2O_3$, and $TiO_2$.

An electrode layer 164 is formed on the insulation layer 155 and the third conductive type semiconductor layer 182. The electrode layer 164 serves as a conductive layer and electrically connects divided areas of the third conductive type semiconductor layer 182.

The electrode layer 164 may be formed of a transparent material or a reflective material. If the electrode layer 164 is a transparent electrode layer, it may be formed of the transparent material such as ITO, ZnO, RuOx, TiOx, and IrOx. If the electrode layer 164 is a reflective electric layer, it is formed of the reflective material such as Al, Ag, Pd, and Rh, Pt.

The semiconductor light emitting device 100C may comprise a lateral-type semiconductor light emitting device or a vertical-type semiconductor light emitting device.

In the description of the first to third embodiments, features of each embodiment may be selectively applied to another embodiment, and are not limited to each embodiment.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
    a first conductive type semiconductor layer including a plurality of upper portions separated from each other;
    an active layer on the first conductive type semiconductor layer and divided into a plurality of active layers;
    a second conductive type semiconductor layer on the active layer and divided into a plurality of second conductive type semiconductor layers, the plurality of second conductive type semiconductor layers being physically separated;
    a plurality of grooves dividing the plurality of upper portions of the first conductive type semiconductor, the active layer, and the second conductive type semiconductor layer into the plurality of upper portions, the plurality of active layers and the plurality of second conductive type semiconductor layers, respectively;
    a plurality of insulation layers in the plurality of grooves, the plurality of insulation layers physically separated from each other;
    a transparent electrode layer on a top surface of the plurality of second conductive type semiconductor layers and on a top surface of the plurality of insulation layers; and
    an electrode on the transparent electrode layer,
    wherein the plurality of active layers are physically separated and the plurality of insulation layers are physically separated from each other,
    wherein the first conductive type semiconductor layer includes a lower portion disposed under the plurality of upper portions and the plurality of grooves, and wherein the plurality of grooves each have a depth from the lower portion of the first conductive type semiconductor layer to a lower surface of the transparent electrode layer.

2. The semiconductor light emitting device according to claim 1, wherein the plurality of active layers are on the plurality of upper portions of the first conductive type semiconductor layer and a lower surface of each of the plurality of insulation layers contacts an upper surface of the lower portion of the first conductive type semiconductor layer.

3. The semiconductor light emitting device according to claim 1, wherein the plurality of insulation layers comprise one of $SiO_2$, $Si_3N_4$, $Al_2O_3$, and $TiO_2$.

4. The semiconductor light emitting device according to claim 1, wherein a top surface of each of the plurality of insulation layers is on a different plane than a top surface of the plurality of second conductive type semiconductor layers.

5. The semiconductor light emitting device according to claim 1, wherein at least one of the plurality of grooves has a circular pattern.

6. The semiconductor light emitting device according to claim 1, wherein the transparent electrode layer is electrically connected to the plurality of second conductive type semiconductor layers.

7. The semiconductor light emitting device according to claim 6, wherein the transparent electrode layer is physically contacted with the plurality of insulation layers.

8. The semiconductor light emitting device according to claim 1, wherein the transparent electrode layer is formed of a single layer covering a top surface of the plurality of second conductive type semiconductor layers and the plurality of insulation layers.

9. The semiconductor light emitting device according to claim 1, further comprising a plurality of conductive nitride-based layers between the transparent electrode layer and the plurality of second conductive type semiconductor layers, respectively.

10. A semiconductor light emitting device, comprising:
a substrate;
a first conductive type semiconductor layer on the substrate, the first conductive type semiconductor layer including a plurality of upper portions separated from each other on the substrate;
an active layer on the first conductive type semiconductor layer and divided into a plurality of active layers;
a second conductive type semiconductor layer on the active layer and divided into a plurality of second conductive type semiconductor layers, the plurality of second conductive type semiconductor layers being physically separated;
a plurality of nitride-based layers on the plurality of second conductive type semiconductor layers;
a plurality of grooves among the plurality of upper portions of the first conductive type semiconductor, the plurality of active layers, and the plurality of second conductive type semiconductor layers, respectively;
a plurality of insulation layers in the plurality of grooves, the plurality of insulation layers physically separated from each other; and
a transparent electrode layer on a top surface of the plurality of second conductive type semiconductor layers and on a top surface of the plurality of insulation layers,
wherein the second conductive type semiconductor layer is a p-type semiconductor layer,
wherein a lower portion of the first conductive type semiconductor layer is disposed between a lower portion of the plurality of grooves and a lower surface of the first conductive type semiconductor layer, and
wherein the plurality of grooves have a depth from the plurality of lower portions of the first conductive type semiconductor layer to a lower surface of the transparent electrode layer.

11. The semiconductor light emitting device according to claim 10, wherein the first and second conductive type semiconductor layers include a nitride-based layer.

12. A semiconductor light emitting device, comprising:
a light emitting structure comprising a first conductive type semiconductor layer, a second conductive type semiconductor layer, and an active layer between the first conductive type semiconductor layer and the second conductive type semiconductor layer;
a plurality of grooves dividing the active layer and the second conductive type semiconductor layer into a plurality of active layers and a plurality of second conductive type semiconductor layers;
a plurality of insulation layers in the plurality of grooves, the plurality of insulation layers separated from each other; and
a transparent electrode layer on a top surface of the plurality of second conductive type semiconductor layers and on a top surface of the plurality of insulation layers,
wherein the plurality of active layers and the plurality of second conductive type semiconductor layer are physically separated, respectively,
wherein a lower portion of the first conductive type semiconductor layer is disposed between a lower portion of the plurality of grooves and a lower surface of the first conductive type semiconductor layer, and
wherein the plurality of grooves have a depth from the plurality of lower portions of the first conductive type semiconductor layer to a lower surface of the transparent electrode layer.

13. The semiconductor light emitting device according to claim 12, wherein the plurality of grooves divide an upper portion of the first conductive type semiconductor layer into a plurality of upper portions and a lower surface of the plurality of insulation layers contact an upper surface of the lower portion of the first conductive type semiconductor layer.

14. The semiconductor light emitting device according to claim 12, further comprising:
a plurality of n-type nitride-based semiconductor layers between the plurality of second conductive type semiconductor layers and the transparent electrode layer, respectively,
wherein the second conductive type semiconductor layer is a p-type semiconductor layer, and
wherein the plurality of grooves is disposed among the plurality of n-type nitride-based semiconductor layers.

15. The semiconductor light emitting device according to claim 12, wherein a plurality of lower portions of the transparent electrode layer are spaced apart from each other in the plurality of grooves.

16. The semiconductor light emitting device according to claim 12, further comprising; a first electrode on the first conductive semiconductor layer and a second electrode on the transparent electrode layer.

17. The semiconductor light emitting device according to claim 12, wherein the plurality of insulation layers comprise one of $SiO_2$, $Si_3N_4$, $Al_2O_3$, and $TiO_2$.

18. The semiconductor light emitting device according to claim 12, wherein the transparent electrode layer is physically contacted with a top surface of the light emitting structure and the plurality of insulation layers.

19. The semiconductor light emitting device according to claim 12, further comprising a substrate under the first conductive type semiconductor layer, wherein the first conductive type semiconductor layer is between the active layer and the substrate.

* * * * *